United States Patent [19]
Kosugi

[11] Patent Number: 4,648,708
[45] Date of Patent: Mar. 10, 1987

[54] PATTERN TRANSFER APPARATUS

[75] Inventor: Masao Kosugi, Yokohama, Japan

[73] Assignee: Canon Kabushiki Kaisha, Tokyo, Japan

[21] Appl. No.: 707,826

[22] Filed: Mar. 4, 1985

[30] Foreign Application Priority Data

Mar. 8, 1984 [JP] Japan ................................. 59-42818

[51] Int. Cl.⁴ ...................... G03B 27/42; G03B 27/52
[52] U.S. Cl. ........................................ 355/53; 355/55; 355/77
[58] Field of Search ...................... 355/55, 56, 53, 54, 355/77, 78, 132, 45

[56] References Cited
U.S. PATENT DOCUMENTS 4,179,110 12/1979 Kosugi ............................... 355/78 X
4,298,273 11/1981 Nishizuka et al. ................. 355/53 X Primary Examiner—L. T. Hix
Assistant Examiner—D. Rutledge
Attorney, Agent, or Firm—Fitzpatrick, Cella, Harper & Scinto

[57] ABSTRACT

A pattern transfer apparatus for transferring a pattern onto the member, wherein the dimension variable in dependence on the thickness of the member is detected and, on the basis of the result of detection, the position of the member in the pattern transfer direction is corrected in a shorter time period or before completion of movement of the member to the pattern transfer station.

12 Claims, 4 Drawing Figures

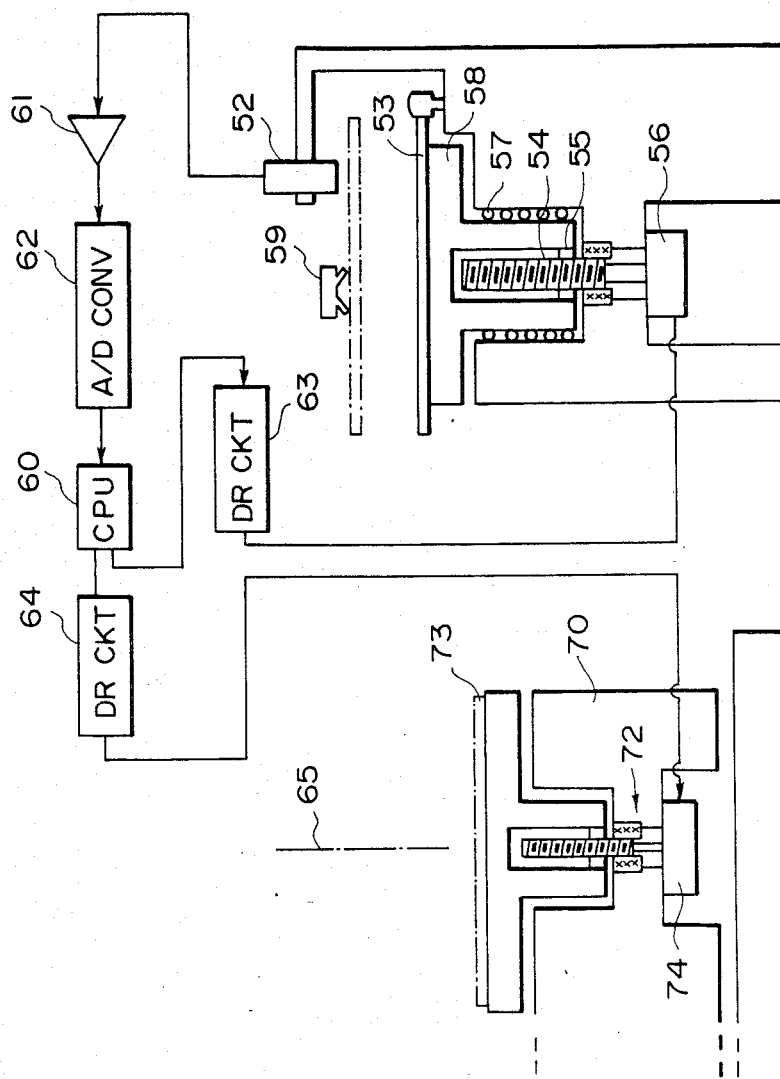
F I G. 4

PATTERN TRANSFER APPARATUS

BACKGROUND OF THE INVENTION

This invention relates to a pattern transfer apparatus and, more particularly, to a pattern transfer apparatus to be used in the manufacture of semiconductor circuit devices.

Referring to FIG. 1, a known type pattern transfer apparatus will be first described. The pattern transfer apparatus shown in FIG. 1 is of reduction projection and step-and-repeat type, called a stepper. The transfer apparatus includes a projection lens 1 for forming, on an image plane 4, an image of a reticle 2 disposed at a predetermined location. The projection lens 1 is provided with non-contact type sensors 6 - 6 which are fixedly secured to the barrel of the projection lens 1 in order to detect the position of the surface of a wafer 3 held by a wafer carriage 5 when the wafer 3 is moved to the pattern transfer station below the projection lens 1. The non-contact type sensors 6 - 6 may comprise air-sensor nozzles or capacitance sensors. Since high precision measurement is effected by these sensors 6 - 6, a gap G between the image plane 4 and these sensors must be maintained very small.

The pattern transfer apparatus further includes an X-Y stage 7 which is movable in parallel to the image plane 4 of the projection lens 1 and has a Z-axis driving mechanism 8 for moving upwardly and downwardly, as viewed in FIG. 1, the wafer carriage 5 and the wafer 3 held by the wafer carriage 5. The wafer 3 is first moved to a position below the projection lens 1 by the X-Y movement of the stage 7 and then is gradually moved upwardly by the Z-axis driving mechanism 8 in accordance with the outputs of the noncontact type sensors 6 - 6 monitoring the distance to the wafer 3 surface, so that the wafer 3 surface is coincident with the image plane 4. Disposed adjacent to the projection lens 1 is an alignment detecting system 10 for detecting a particular pattern or patterns formed on the wafer 3. The alignment detecting system 10 is fixedly secured in a predetermined positional relation with the projection lens 1. The alignment detecting optical system 10 acts as a major alignment-detecting system in the case where the transfer apparatus is of the off-axis alignment type and acts as an auxiliary alignment-detect in the case where the transfer apparatus is of the TTL (Through The Lens) alignment type. The object plane 11 of the alignment detecting system 10 may be on the same plane of the image plane 4 of the projection lens 1, or may be on a plane slightly lower than the image plane 4.

The extent of movement of the X-Y stage 7 is determined such that every portion of the surface of a wafer carried by the carriage 5 can be positioned within the picture field of the projection lens 1, that at least a particular area of the wafer can be observed by the alignment detecting system 10, and that the wafer can be moved to a predetermined wafer loading/unloading position 12. On the other hand, the extent of movement of the Z-axis driving mechanism 8 is determined such that the position of the surface of a wafer having a presumably maxiumum thickness and carried by the carriage 5 when it is in its lowermost position comes lower than the object plane 11 of the alignment detecting system 10 and that the surface of a wafer having a presumably minimum thickness and carried by the carriage 5 can be moved to a position higher than the image plane 4 of the projection lens 1.

In operation of the transfer apparatus shown in FIG. 1, a wafer onto which the pattern of the reticle 2 has been transferred is replaced by a new, not yet exposed, wafer 3 at the wafer loading/unloading position 12. The newly placed wafer 3 is fixedly held by the carriage 5. The loading/unloading of the wafers is carried out with the Z-axis driving mechanism 8 being maintained at its reference position which is usually the lowermost position. Subsequently, the wafer 3 is moved to the pattern transfer station, i.e., the position which is below, as viewed in FIG. 1, the projection lens 1 by means of the X-Y stage 7. Since in the FIG. 1 arrangement the thickness of the wafer 3 carried by the carriage 5 is not at all detected, Z-axis movement (upward movement in FIG. 1) should not be initiated during the X-Y movement of the stage 7. If, to the contrary, the wafer 3 surface is moved upwardly beyond the image plane 4 of the projection lens 1 during the X-Y movement of the stage 7, the wafer 3 surface will collide against the barrel of the projection lens 1 because the gap G is very small as described in the foregoing. In view of this, the upward movement of the wafer 3 is initiated after the stage 7 and therefore the wafer 3 reach the pattern transfer position under the projection lens 1. The Z-axis movement is carried out while measuring the distance between the wafer surface and the end face of the projection lens 1 by means of the non-contact sensors 6 - 6. When the wafer 3 surface is coincident with the image plane 4, the Z-axis movement is terminated. If the wafer 3 is virgin, i.e. if the reticle 2 is the first reticle, it is not necessary to align the reticle 2 and the wafer 3 with each other. Therefore, an exposure step is initiated immediately after completion of the Z-axis movement. If the reticle 2 is not the first reticle, i.e. if any pattern has been formed on the wafer 3 during the preceding pattern transfer operation, the alignment between the reticle 2 and the wafer 3 is necessary. In such case, the X-Y stage 7 is moved to move the wafer 3 surface from the position of the image plane 4 to the position of the object plane 11 in order that the alignment mark formed on the wafer 3 is positioned within the viewing field of the alignment detecting system 10 to achieve alignment of the particular pattern already formed on the wafer 3 surface. As described in the foregoing, the object plane 11 of the alignment detecting system 10 is on the same plane as the image plane 4 of the projection lens 1 or on the plane lower than the image plane 4. In the latter case, Z-axis movement to the object plane 11 is effected simultaneously with the movement of the X-Y stage 7. The difference or deviation A between the imaging plane 4 of the projection lens 1 and the object plane 11 of the alignment detecting system 10 is a fixed value for a particular transfer apparatus. Therefore, by designating Z-axis movement of an amount A, the wafer 3 surface becomes coincident with the object plane 11.

Such operation is illustrated in FIG. 2 with respect to the locus of the displacement of a particular point on the wafer 3 surface. The locus is shown by a broken line. Apparently, the movement to the object plane 11 of the detecting system 10 includes useless motion which requires useless time. This inefficiency leads to a decreased throughput.

It will be possible to provide a separate focus detecting system adjacent to the alignment detecting system 10. If, in such case, the Z-axis movement is made simultaneously with the movement of the X-Y stage 7 so that the wafer 3 surface is directly moved to the object surface 11, the locus of displacement of the particular point on the wafer 3 surface will be such as shown by a dash-and-dot line or a dash-and-dots line. Whether the displacement follows the dash-and-dot line or the dash-and-dots line depends on the thickness of the wafer 3. Particularly, in the former case, however, the wafer 3 surface will possibly collide against the projection lens 1 because the alignment detecting system 10 is disposed close to the projection lens 1. Even if there is no limitation by the projection lens 1 due to the presence of the gap G, discrimination of the direction of movement to be made and measurement of the distance are still necessary. As the result, it is still necessary to gradually move the wafer 3 surface toward the object surface 11. This requires a prolonged time for the operation.

SUMMARY OF THE INVENTION

It is accordingly a primary object of the present invention to provide a pattern transfer apparatus capable of correcting the position of a member, onto which a pattern is to be transferred, in the pattern transfer direction in a shorter time period or before completion of movement of the member to the pattern transfer station.

It is another object of the present invention to provide a pattern transfer apparatus which assures an improved throughput.

It is a further object of the present invention to provide a pattern transfer apparatus usable in the manufacture of semiconductor circuit devices.

Briefly, according to the present invention, there is provided a pattern transfer apparatus for transferring a pattern onto a member, wherein the dimension variable in dependence on the thickness of the member is detected and, on the basis of the result of detection, the position of the member in the pattern transfer direction is corrected in a shorter time period or before completion of movement of the member to the pattern transfer station.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is a diagrammatic and sectional view schematically showing a pattern transfer apparatus according to another embodiment of the present invention.

DESCRIPTION OF THE PREFERRED EMBODIMENTS

In the following description, the direction of the optical axis of the projection lens will be referred to "direction Z", and the directions contained in a plane perpendicular to the optical axis of the projection lens will be and orthogonally intersecting with each other will be referred to as "direction X" and "direction Y", respectively. This is only for the sake of convenience.

Figure 1:
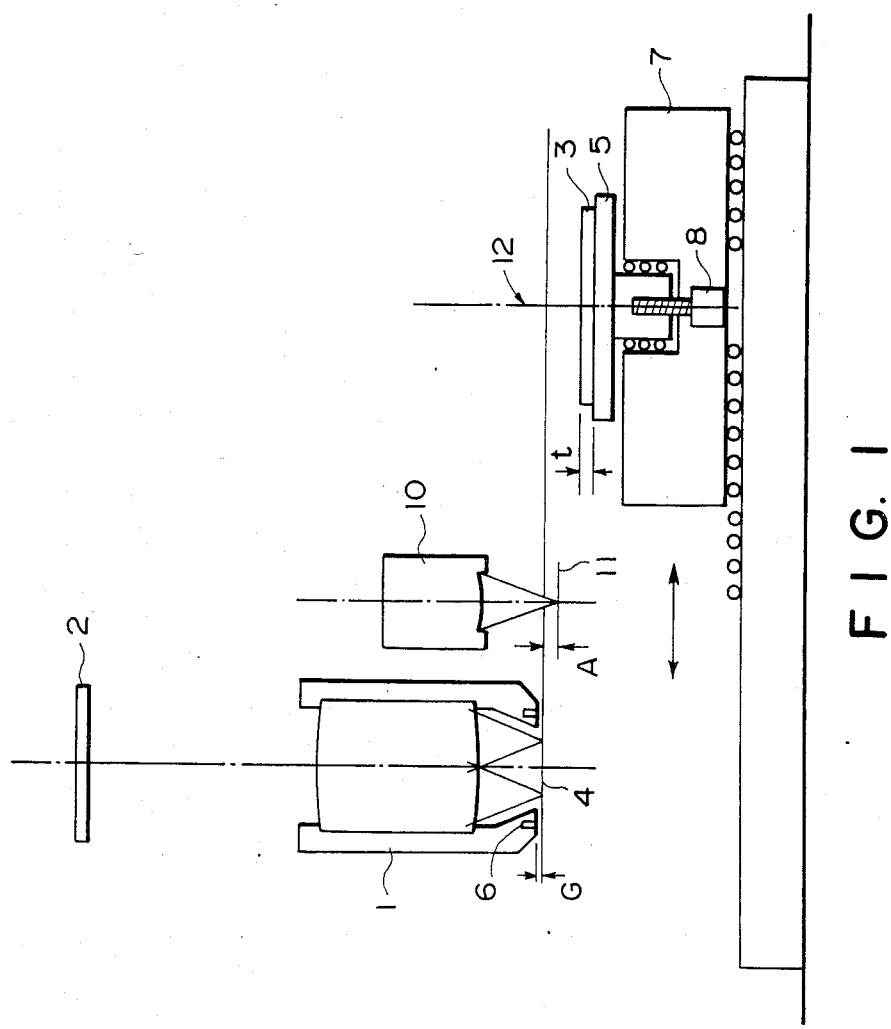
FIG. 1 is a sectional view schematically showing an example of known type patter transfer apparatus.
Figure 3:
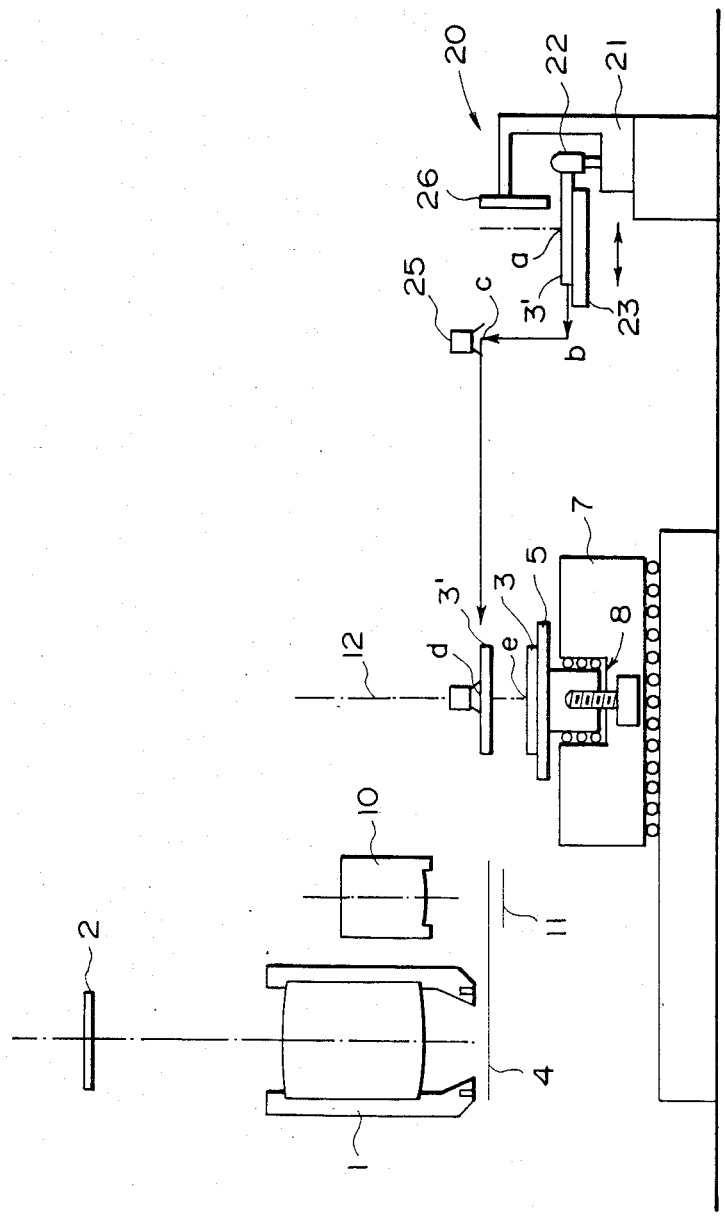
FIG. 3 is a sectional view schematically showing a pattern transfer apparatus of reduction projection type according to an embodiment of the present invention.

FIG. 3 shows a pattern transfer apparatus of reduction projection type, according to an embodiment of the present invention. The elements of the pattern transfer apparatus of FIG. 3 corresponding to those of FIG. 1 apparatus are denoted by corresponding reference numerals. In FIG. 3, denoted generally by reference numeral 20 is a prealignment station at which rough positioning or alignment of the wafer 3' carried thereto from an unshown wafer containing unit is effected, using the peripheral shape of the wafer 3' as a reference. A prealignment reference stage 21 has a plurality of positioning pins 22 only one of which is shown in FIG. 3. By abutting a flat portion of the periphery of the wafer 3' against the positioning pins 22, the wafer 3' is positioned. Disposed under the wafer 3' is a wafer supporting plate 23 for holding the wafer 3' with means of a vacuum or the like. Upon upward movement as viewed in FIG. 3, the wafer 3' is once moved in the direction from a point a to another point b in order to prevent damage of the wafer 3' by the positioning pins 22.

Subsequently, the wafer 3' is moved apart from the wafer supporting plate 23 to a point c by conveyor means 25, such as a swingable arm, having a wafer holding mechanism. From the point c, the wafer 3' is moved by the conveyor means 25 to a position d above a wafer interchanging station 12 whereat the wafer 3' stands by for a time period. Usually, the series of these operations are effected relative to the wafer 3', which is to be subsequently processed, within the time period during which the wafer 3 carried on an x-y stage 7 is subjected to an alignment operation with a reticle 2, an exposure process, etc. Further, these operations are completed within a predetermined time period necessary for transferring the pattern of a reticle 2 onto the entire surface of the wafer 3. Therefore, addition of any specific operation relative to the wafer 3', if it is completed within the time period necessary for the alignment, exposure, etc. relative to the wafer 3, the processing speed of the apparatus itself would not be affected thereby.

When, after completion of the alignment step, exposure step, etc., the wafer 3 is moved to the wafer interchanging station 12, the wafer 3 is removed from the wafer carriage 5 by means of an unshown wafer unloading mechanism and the wafer 3' to be newly processed is placed on the wafer carriage 5. Thus, the wafer 3' is positioned at a point e.

Denoted by reference numeral 26 in FIG. 3 is a detector for detecting dimensional information which is variable in dependence on the thickness of the wafer carried by the wafer supporting plate 23. Particularly the detector 26 in the present embodiment is adapted to detect the position of the wafer surface to detect the thickness of the wafer carried by the wafer supporting plate 23. The detector 26 is fixedly secured to the prealignment reference stage 21, and is adapted to detect the surface of the wafer when the prealignment operation therefor is completed. The result of detection is stored in an unshown memory unit. Preferably, the detector 26 comprises a noncontact type sensor for the purpose of preventing damage of the wafer surface. According to the present embodiment, the detector 26 is fixedly secured and detects the thickness of the wafer 3' on the basis of the difference between the distance to the wafer 3' surface and the distance to the wafer supporting plate 23.

Figure 2:
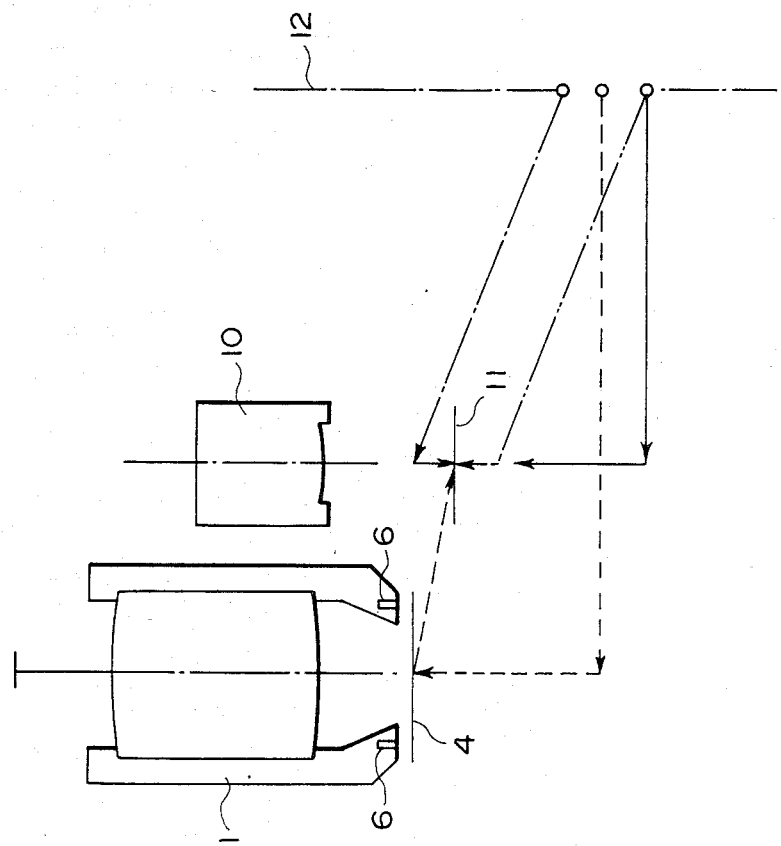
FIG. 2 is a schematic view showing an example of displacement of the wafer in the pattern transfer apparatus of FIG. 1.

With the above-described arrangement of the pattern transfer apparatus according to the present embodiment, the thickness of the wafer 3' has already been stored in the unshown memory unit, when the wafer 3' is carried by the wafer carriage 5. As the result, when the wafer 3' is to be moved to oppose the projection lens 1 or the alignment detecting system 10, the wafer 3' can be moved in the direction Z by the Z-axis driving mechanism 8 simultaneously with the movement thereof in the directions of X and Y by the stage 7. More specifically, while moving the wafer 3' in the directions of X and Y by the stage 7, the wafer carriage 5 drives the wafer 3' upwardly as viewed in FIG. 3 with the amount of drive thereof being controlled in accordance with the difference between the detected thickness of the wafer 3' and the distance between the plane 4 or 11 and the upper surface of the carriage 5 when it is in its lowermost position. That is, the movement of the carriage 5 is controlled so that the upper surface thereof is moved to a position which is spaced from the plane 4 or 11 through a distance corresponding to the thickness of the wafer 3'.

Where the Z-axis driving mechanism 8 includes a piezo-electric device or the like whose displacement can be controlled very precisely, the wafer 3' surface can be directly positioned in the plane 4 or 11, on or before completion of X-Y movement of the wafer 3', by the controlled drive of the Z-axis driving mechanism. Even if the displacement of the Z-axis driving mechanism can not be controlled very precisely, the wafer 3' surface can be moved to a position which is very close to the plane 4 or 11, at least when the X-Y movement is completed. In such case, fine position adjustment of the wafer 3' may thereafter be effected by using non-contact type gap sensors such as air micronozzles. In this case, however, the time required for the exact positioning of the wafer 3' surface is still significantly shortened as compared with the FIGS. 1 and 2 case, since the wafer 3' surface has already been moved to a position very close to the plane 4 or 11 by the controlled drive of the Z-axis driving mechanism, at least when the X-Y movement of the wafer 3' by the stage 7 is completed.

As described in the foregoing, the detector 26 comprises the non-contact type sensor. The range of distance which can be stably and accurately measured by the non-contact type sensor is limited. The higher the required accuracy is, the narrower the measurable range is. Accordingly, the measurement accuracy becomes unstable relative to the exceedingly varying thickness of the wafer.

In view of this, the pattern transfer apparatus according to another embodiment is provided with an arrangement for adjusting the positional relation between the wafer and the detector for detecting the thickness of the wafer. FIG. 4 shows such pattern transfer apparatus.

The pattern transfer apparatus shown in FIG. 4 includes a prealignment reference stage 51 and a non-contact type sensor 52 which is fixedly secured to the upper portion of the prealignment reference stage 51. A wafer supporting plate 58 is effective to hold a wafer 53 by means of a vacuum or the like and is arranged to be moved upwardly and downwardly (i.e. in the direction of Z) by the combination of a screw 54, nut 55 and pulse motor 56. Denoted by reference numeral 57 is a guide member.

In operation, the wafer supporting plate 58 is first driven without carrying any wafer thereon. That is, the wafer supporting plate 58 is moved upwardly by the drive of the pulse motor 56 in accordance with an instruction signal supplied thereto from a driving circuit 63. The detector 52 in the present embodiment detects the surface position of the wafer supporting plate 58 and produces a detection output which is supplied to a central processing unit (CPU) 60 via an amplifier 61 and an analog-to-digital (A/D) converter 62. The central processing unit 60 monitors the detection output produced by the detector 52 and, when it reaches a predetermined value, reads the amount of drive of the pulse motor at that time.

Subsequently, similar operation is effected with the wafer supporting plate 58 carrying a wafer 53 thereon. During this similar operation, however, the detector 52 in the present embodiment detects the surface position of the wafer 53 and the central processing unit 60 reads the amount of drive of the pulse motor 56 when the detection outputs produced by the detector 52 reaches the above-mentioned predetermined value. Thereafter, the central processing unit 60 calculates the difference between the amount of drive of the pulse motor 56 when no wafer is carried by the wafer supporting plate and that when the wafer 53 is carried by the wafer supporting plate 58. The difference is stored in a memory unit within the central processing unit 60.

When the detection of the surface position of the wafer 53 is completed, the wafer surface is located at or close to a predetermined upper position. Therefore, conveyor means 59 receives the wafer 53 substantially without moving toward the wafer 53. On the other hand, the wafer supporting plate 58 releases holding of the wafer and moves downwardly back to the lowermost position. Simultaneously therewith, the conveyor means 59 moves horizontally to move the wafer 53 to a wafer interchanging station 65 of an X-Y stage 70 and then places the wafer 53 on the X-Y stage 70.

The X-Y stage 70 is arranged to execute a predetermined motion along the X-Y plane to achieve positioning with respect to the X and Y co-ordinates. Along with this positioning, a driving circuit 64 supplies, to a pulse motor 74 in a Z-axis driving mechanism 72, a predetermined pulse signal in accordance with the difference, corresponding to the thickness of the wafter 53, stored in the memory unit, so that the pulse motor 74 is driven to achieve positioning with respect to the axis Z. Bu this, the surface of the wafer 53 can be directly coincident with the object plane 11 of the alignment detecting system. It is desirable that the displacement of the wafer 53 follows an inclined line because it needs only a minimum time.

In accordance with the present invention, as has hitherto been described, the thickness of the wafer is measured within the time period during which the alignment step, exposure step, etc. are carried out for the preceding wafer. By this, the positioning operation for the wafer to be subsequently processed can be simplified, so that the entire process time of the pattern transfer apparatus can be reduced. It will be easily understood that the present invention is applicable also to a pattern transfer apparatus which does not include an auxiliary alignment detecting system, so that the alignment is executed by positioning the wafer surface in the image plane of the projection lens, i.e. the image plane of the TTL alignment system.

Further, according to the present invention, the positioning of the wafer in the Z-axis direction may be effected simultaneously with the positioning in the direction X and Y. By this, the process time for the wafers can be reduced significantly, which leads to significant improvements in the manufacturing efficiency.

While the invention has been described with reference to the structures disclosed herein, it is not confined to the details set forth and this application is intended to cover such modifications or changes as may come within the purposes of the improvements or the scope of the following claims.

What is claimed is:

1. A pattern transfer apparatus for transferring a pattern onto a member, comprising:
    optical means;
    means for detecting a dimension variable in dependence upon the thickness of the member, said detecting means producing a detection signal; and
    means for correcting the position of the member in the direction of the optical axis of said optical means in accordance with the detection signal produced by said detecting means, said correcting means correcting the position of the member when the member is between a station for said optical means and a station for said detecting means.

2. An apparatus according to claim 1, wherein said correcting means is movable to said station for said optical means while carrying thereon the member.

3. An apparatus according to claim 2, wherein said correcting means corrects the position of the member in the direction of the optical axis of said optical means during movement of said correcting means to said station for said optical means.

4. An apparatus according to claim 3, wherein said optical means is effective to achieve alignment of the member.

5. An apparatus according to claim 1, wherein said optical means includes a first optical system for aligning the member with a pattern to be transferred onto the member and a second optical system for transferring the pattern onto the member.

6. An apparatus according to claim 5, wherein said correcting means corrects a positional relation between said first optical system and the member and then corrects a positional relation between said second optical system and the member.

7. An apparatus according to claim 1, wherein said detecting means is disposed at a station at which alignment of the member is effected in dependence upon the shape of the member.

8. A pattern transfer apparatus for transferring a pattern onto a member, comprising:
    means for detecting a dimension which varies as a function of the thickness of the member and producing a detection signal, wherein said detecting means detects the dimension prior to movement of the member to a pattern transfer station and wherein said detecting means is disposed at a station at which alginment of the member is effected depending upon the shape of the member; and
    means for correcting the position of the member in the direction of pattern transfer in accordance with the detection signal, wherein said correcting means is movable to the pattern transfer station and corrects the position of the member in the direction of pattern transfer before completion of movement of the member to the pattern transfer station.

9. An apparatus according to claim 8, wherein said detecting means includes a support for the member and a gap sensor.

10. An apparatus according to claim 9, wherein said gap sensor detects the surface position of the member carried by said support, whereby the thickness of the member is detected.

11. An apparatus according to claim 9, wherein said support is movable in the direction of sensing by said gap sensor.

12. An apparatus according to claim 11, wherein said detecting means detects the thickness of the member on the basis of the difference between the amount of movement of said support effected until an output of said gap sensor with respect to the surface of said support reaches a predetermined value and an amount of movement of said support effected until the output of said gap sensor with respect to the surface of the member carried by said support reaches the predetermined value.

* * * * *